(12) United States Patent
Hardy et al.

(10) Patent No.: US 9,689,950 B2
(45) Date of Patent: Jun. 27, 2017

(54) SYSTEMS AND METHODS FOR SELF-CALIBRATED, NONLINEAR PHASE CONTRAST CORRECTION OF MAGNETIC RESONANCE IMAGES

(71) Applicant: General Electric Company, Schenectady, NY (US)

(72) Inventors: Christopher Judson Hardy, Niskayuna, NY (US); Anja Christina Sophie Brau, Menlo, CA (US); Ek Tsoon Tan, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 574 days.

(21) Appl. No.: 14/272,756

(22) Filed: May 8, 2014

(65) Prior Publication Data
US 2015/0309144 A1    Oct. 29, 2015

Related U.S. Application Data

(60) Provisional application No. 61/985,675, filed on Apr. 29, 2014.

(51) Int. Cl.
*G01R 33/563* (2006.01)
*G01R 33/56* (2006.01)

(52) U.S. Cl.
CPC .... *G01R 33/56316* (2013.01); *G01R 33/5607* (2013.01)

(58) Field of Classification Search
CPC .................. G01R 33/5607; G01R 33/56316
See application file for complete search history.

(56) References Cited

U.S. PATENT DOCUMENTS

| 5,281,914 | A | 1/1994 | Conturo et al. |
| 7,202,662 | B2 * | 4/2007 | Markl ............. G01R 33/56518 324/306 |

(Continued)

FOREIGN PATENT DOCUMENTS

| JP | 09-068565 A | 3/1997 |
| WO | 2012/033264 A1 | 3/2012 |
| WO | 2013155209 A1 | 10/2013 |

OTHER PUBLICATIONS

Lew, Calvin et al., "Breathheld Autocalibrated Phase-Contrast Imaging", Journal of Magnetic Resonance Imaging, vol. 21, Issue 4, 2010, (pp. 1004-1014, 11 total pages).

(Continued)

*Primary Examiner* — Gregory H Curran
(74) *Attorney, Agent, or Firm* — Pabitra K. Chakrabarti (57) ABSTRACT

A system and method of self-calibrated correction for residual phase in phase-contrast magnetic resonance (PCMR) imaging data. The method includes receiving PCMR image data from an MR scanner system, segmenting static tissue from non-static cardiovascular elements of the image data, calculating a non-linear fitted-phase basis function, the non-linear fitted-phase basis function based on system artifacts of the PCMR system, adding the non-linear fitted-phase basis function to linear fit terms, and subtracting the result of the adding step from the PCMR imaging data. The system includes a PCMR scanning apparatus configured to provide PCMR image data, a scanner control circuit configured to control the scanning apparatus during image acquisition, the scanner control circuitry in communication with a control processor, the control processor configured to execute computer-readable instructions that cause the control processor to perform the method. A non-transitory computer-readable medium is also disclosed.

20 Claims, 7 Drawing Sheets

(56) References Cited

U.S. PATENT DOCUMENTS

| | | | |
|---|---|---|---|
| 7,292,032 B1 * | 11/2007 | Polzin | G01R 33/56308 |
| | | | 324/306 |
| 7,755,355 B2 | 7/2010 | Polzin | |
| 7,847,545 B2 | 12/2010 | Wiesinger et al. | |
| 8,148,984 B2 | 4/2012 | Johnson et al. | |
| 8,897,519 B2 * | 11/2014 | Guhring | A61B 5/0263 |
| | | | 382/128 |

OTHER PUBLICATIONS

Walker, Peter G. et al., "Semiautomated Method for Noise Reduction and Background Phase Error Correction in MR Phase Velocity Data", Journal of Magnetic Resonance Imaging, vol. 3, Issue 3, May / Jun. 1993, (pp. 521-530, 10 total pages).

Lankhaar, Jan-Willem et al., "Correction of Phase Offset Errors in Main Pulmonary Artery Flow Quantification", Journal of Magnetic Resonance Imaging, vol. 22, (2005), DOI:10.1002/jmri.20361, (pp. 73-79, 7 total pages).

Chernobelsky, Alexander et al., "Baseline Correction of Phase Contrast Images Improves Quantification of Bllod Flow in the Great Vessels", Journal of Cardiovascular Magnetic Resonance, vol. 9, (2007), ISSN: 1097-6647, DOI: 10.1080/1097664061187588, (pp. 681-685, 5 total pages).

Holland, Brian J. et al., "Baseline Correction of Phase-Contrast Images in Congenital Cardiovascular Magnetic Resonance", Journal of Cardiovascular Magnetic Resonance, vol. 12, No. 11 (2010), 7pgs.

Lingamneni, Anila et al., "Validation of Cine Phase-Contrast MR Imaging for Motion Analysis", Journal of Magnetic Resonance Imaging, vol. 5, No. 3, May / Jun. 1995, (pp. 331-338, 8 total pages).

* cited by examiner

SYSTEMS AND METHODS FOR SELF-CALIBRATED, NONLINEAR PHASE CONTRAST CORRECTION OF MAGNETIC RESONANCE IMAGES

CLAIM OF PRIORITY

This patent application claims the benefit of priority, under 35 U.S.C. §119(e), of U.S. Provisional Patent Application Ser. No. 61/985,675, filed Apr. 29, 2014, titled "SYSTEMS AND METHODS FOR SELF-CALIBRATED, NONLINEAR PHASE CONTRAST CORRECTION OF MAGNETIC RESONANCE IMAGES" the entire disclosure of which is incorporated herein by reference.

BACKGROUND

Blood flow and velocity through the cardiovascular system can be used to diagnose disorders, such as congenital heart disease and valve abnormalities. Accurate diagnosis of these disorders requires obtaining both qualitative assessment and accurate quantitative measurement of the blood velocity. Magnetic resonance (MR) is one tool used to measure the blood velocity.

Phase-contrast Cardiovascular Magnetic Resonance Imaging (CMR) is typically used to provide such accurate blood velocity measurements. Typically, velocity-encoded gradient waveforms are used to provide encoding of the velocity in the phase of the MR image. When compared against an un-encoded MR image, the difference in phase is proportional to the velocity. In addition, it is also often necessary to calibrate this velocity to a zero velocity baseline reference—e.g., that from stationary tissue adjacent to a blood vessel. However, such calibration is difficult to perform in CMR of the heart and great vessels because often there is no, or minimal, stationary tissue adjacent to the heart and large blood vessels. Therefore, uncorrected velocity offsets may introduce substantial errors in velocity flow quantification.

Background phase bias due to presence of eddy-currents and random noise can also adversely affect the quality of MR phase velocity measurements. Conventionally, background phase bias can be reduced by identifying static tissue within the phase contrast image. This criterion for static tissue is determined by calculating time standard deviations of the phase velocity images over a cardiac cycle, and identifying as static regions those portions with a low standard deviation. Because the vessels, or objects, of interest are far from static, using a conventional, linear-fitted velocity correction can result in under-fitting. Conversely, fitting with higher spatial orders can result in over-fitting because of the lack of data points near the vessels or objects of interest. The choice of basis functions for these higher spatial orders is not generally based on physical properties of the MRI scanner.

DETAILED DESCRIPTION

In accordance with embodiments, a self-calibrated correction for the residual phase in phase-contrast MRI can use a nonlinear fit of the phase in static tissue. In accordance with implementations, the fitted phase can then be applied to the non-static vascular components of the MR image by subtracting the fitted phase from the phase obtained from phase-contrast MRI. Embodying systems and methods apply one predetermined nonlinear term to the fitting basis functions to achieve the nonlinear fitting—the nonlinear spatial basis of the fitted phase is fixed. The nonlinear basis is added to the linear fit terms. For three dimensions, there can be five terms to be determined in the fit. These are a constant, X, Y, Z, and a nonlinear term—where X, Y, and Z are the spatial coordinates of the relevant pixels of the image. One physical property of the scanner that can be used is the concomitant field, resulting in an added nonlinear basis function, which has been observed to be very similar to the residual background phase. Another nonlinear basis function can be a predetermined eddy current field map. In accordance with some embodiments, the fitted result can be improved by other features—for example, iterative outlier removal of tissue boundaries; inclusion of the quiescent phase for fitting; and/or effect-size weighting to reduce over-fitting.

This nonlinear self-calibrated approach relies on knowing the nonlinear shape. Empirical observation shows that the residual phase is similar in shape to that of the concomitant field. Therefore as compared to linear fitting that uses for basis functions four terms (constant, X, Y, and Z), the hybrid, nonlinear-fit, in accordance with embodiments, has an added basis function of the concomitant field, resulting in five terms. The fit can be further improved by iteratively removing outliers that occur at tissue boundaries during the static-tissue segmentation. Further, added static-tissue segmentation can be performed using velocities from the quiescent cardiac phase, which can result in a fit that includes the velocities from both the averaged phase and the quiescent phase.

In accordance with some implementations, the corrected phase can be weighted by the effect size of the fit to contain over-fitting so as to improve the accuracy of the fitted result. For example, one implementation to determine the effect size of the fit can be to compare the distribution of the fitted phase against a predetermined, desired upper and lower limit of a predetermined, desired velocity accuracy. If the distribution of the fitted phase falls within the predetermined, desired accuracy limits, a small weight is assigned. If the distribution falls outside the limits, a large weight is assigned. One way to determine whether this distribution falls inside or outside the limits is by simply considering the ratio (or probability) of pixels within these limits to all pixels. In one implementation, the assigned weight can be the probability of the fitted phase exceeding previously-proposed velocity specification limits of about +/−6 mm/sec—i.e., if the fitted phase has a small effect, no correction is done.

Figure 1:
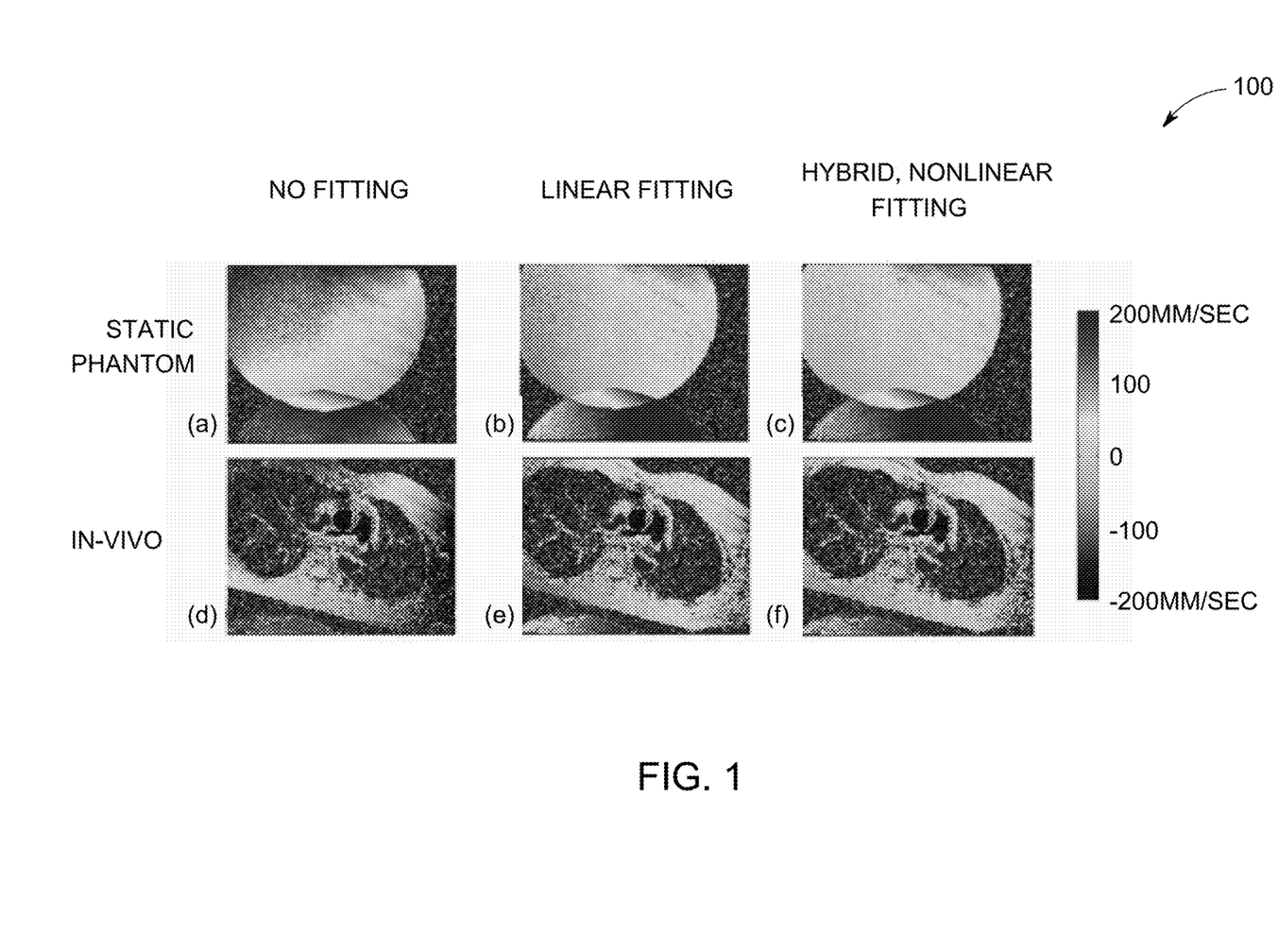
FIG. 1 depicts images of velocity maps in accordance with some embodiments.

In accordance with some embodiments, the workflow of phase contrast correction can be improved with the application of this self-calibrated correction. The nonlinear spatial basis can result in improved accuracy of the phase fit as compared to a linear fit or a nonlinear fit with an arbitrary number of nonlinear terms. This in turn yields an improved accuracy of the corrected phase contrast velocity maps. Fixing the nonlinear basis can prevent statistical overfitting of the phase, as compared to allowing for numerous higher-order spatial terms. This nonlinear basis for fitting is superior to linear basis only, as linear will result in under-fitting FIG. 1 depicts velocity map images 100A-F in accordance with some embodiments. Velocity map images 100A-F includes 2D CINE-PC velocity maps from static phantom (100A-C) and in-vivo scans (100D-F). To obtain these images, twelve normal subjects were imaged at 3 T and 1.5 T with 2D CINE-PC using varying imaging parameters, yielding thirty-one phase contrast (PC) images. Images 100A, 100D have no fitting applied; images 100B, 100E have only linear fitting; and images 100C, 100F have hybrid, nonlinear fitting in accordance with some embodiments. The static phantom images provide a set of baseline images as ground truth for comparison purposes. Any residual motion in the assumed static-phantom and any possible thermal-drift in the MRI system may bias phantom results; hence, a phantom calibration approach using a direct subtraction of the phantom phase may be neither feasible nor accurate. The linear-fitting resulted in reduced residual velocity in static tissue and in the phantom. A further reduction in residual velocity from application of the hybrid, nonlinear fitting, in accordance with embodiments, can be observed in images 100C, 100F.

Figure 2:
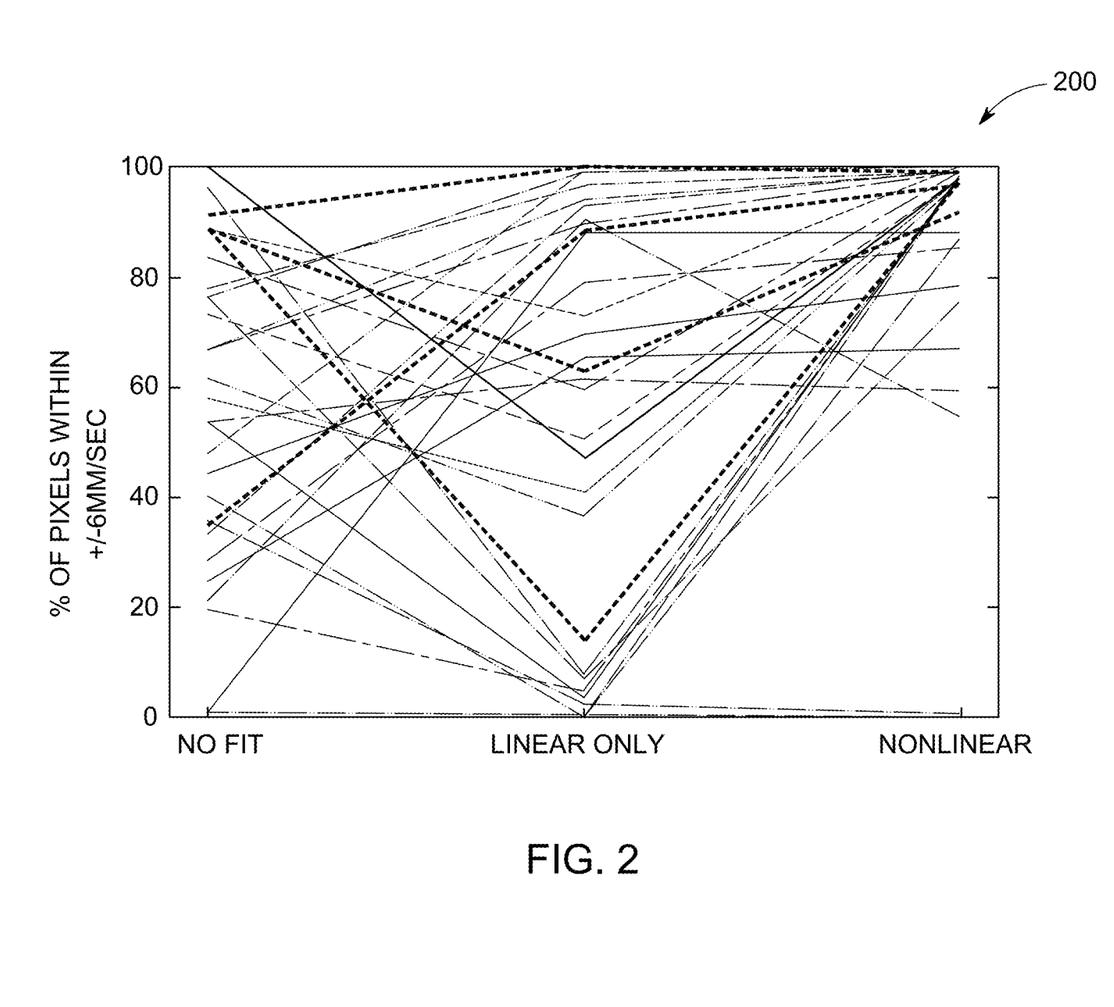
FIG. 2 depicts plots of percentage of pixels within a predetermined velocity limit in accordance with some embodiments.

FIG. 2 depicts plots 200 of percentage of pixels within a predetermined velocity limit in accordance with some embodiments. By way of example, the predetermined velocity limit for plots 200 is +/−6 mm/sec. However, other values for the predetermined velocity limits are equally available for implementation.

Plots 200 represent the percentage of pixels within +/−6 mm/sec velocity limits as obtained from the measurements (i.e., with no fitting, linear-only fitting, and hybrid, nonlinear fitting) of the thirty-one CINE phase-contrast images of FIG. 1. Twenty-seven images were acquired from eleven subjects at 3 T (solid line plots) and four images were acquired from one subject at 1.5 T (dashed line plots).

Plots 200 show that an embodying hybrid, nonlinear-fitting was overall superior to the other two methods in providing a higher percentage of pixels within the predetermined, desired velocity limits. The data points of plots 200 were connected (no-fitting, linear-fitting and hybrid nonlinear-fitting) to demonstrate that nonlinear was superior to the other two methods, even in data points with high percentages with no-fitting and linear-fitting. FIG. 2 depicts that of the images with no fitting, about 13% of the instances have greater than about 90% pixels within a 4-cm radius of iso-center within the velocity limits. With linear fitting, about 22.5% of the instances have greater than about 90% of pixels within the velocity limits.

As depicted in FIG. 2, the linear fitting has a detrimental impact on about fourteen of the instances (compared to their respective no fitting instances). However, as depicted in FIG. 2, with hybrid, nonlinear fitting in accordance with some embodiments, about 81% of the instances have greater than about 90% of pixels within the velocity limits—including providing a marked improvement from their respective linear fitting instances. Accordingly, the measurements show that the hybrid, nonlinear fitting in accordance with some embodiments, is superior to both the no-fitting, and the linear-fitting examples.

Figure 3:
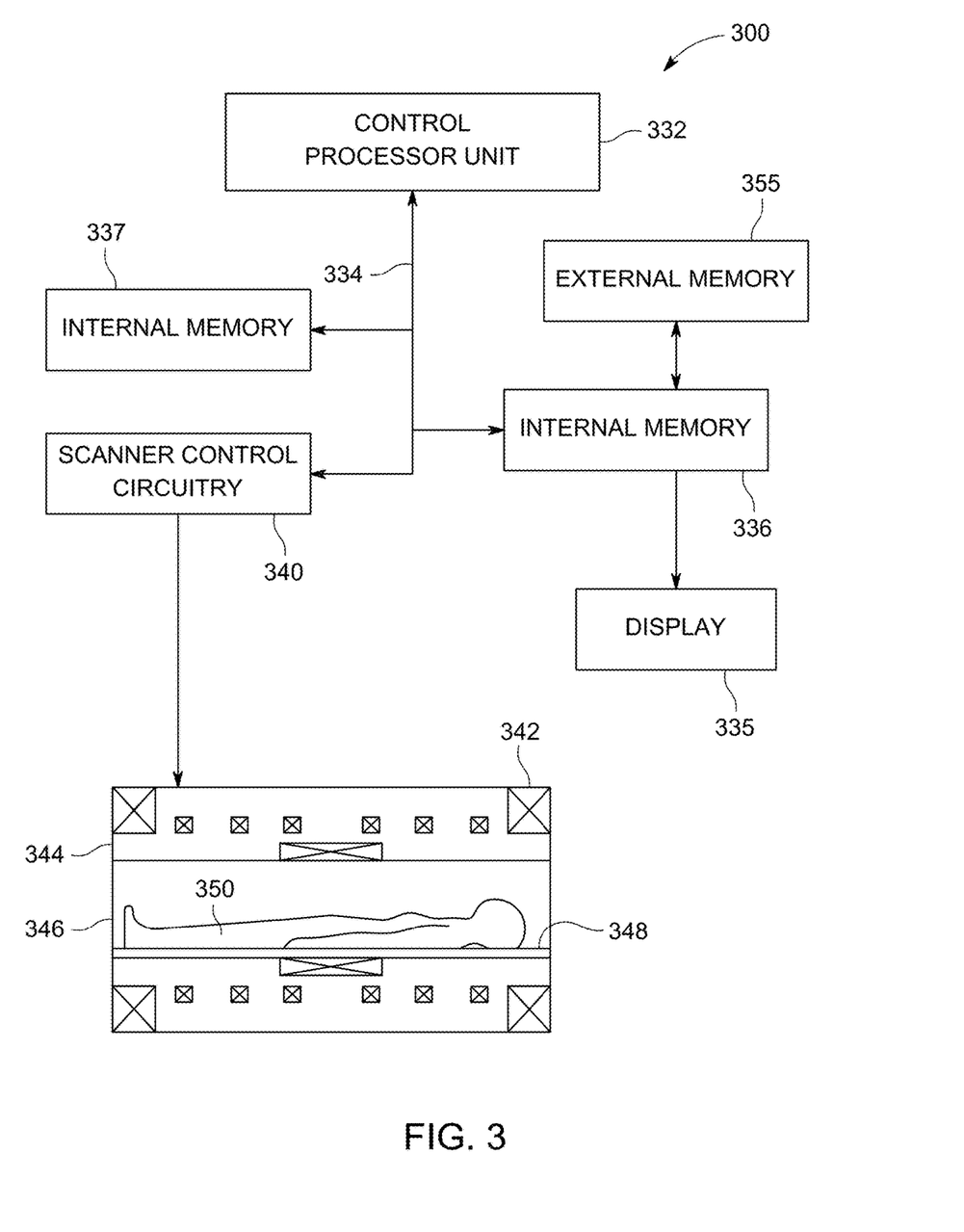
FIG. 3 depicts a system 300 in accordance with some embodiments.

FIG. 3 depicts MRI system 300 configured to implement a self-calibrated, hybrid, nonlinear phase-contrast correction method, according to some embodiments. MRI system 300 can include a central control processor unit 332 coupled to internal memory 337 and input/output (I/O) interface port 336 via internal bus 334. The control processor can execute computer readable instructions to implement scanner control circuitry 342. MRI system 300 can be generally coupled through the I/O interface 336 to a display 335 and various input devices such as a mouse and/or a keyboard (not shown).

The MRI system can include a pulse generator module that provides waveforms to carry out the desired scan sequence and produces data which indicates the timing, strength and shape of the RF pulses produced, and the timing and length of the data acquisition window. The pulse generator module connects to a set of gradient amplifiers, to indicate the timing and shape of the gradient pulses that are produced during the scan.

The gradient waveforms produced by the pulse generator module are applied to a gradient amplifier system having Gx, Gy, and Gz amplifiers. Each gradient amplifier excites a corresponding physical gradient coil in an assembly to produce the magnetic field gradients used for spatially encoding acquired signals. The gradient coil assembly forms part of a magnet assembly which includes a polarizing magnet and a whole-body RF coil. A transceiver module in system control produces pulses which are amplified by an RF amplifier and coupled to an RF coil by a transmit/receive switch.

The resulting signals emitted by the excited nuclei in the patient may be sensed by the same RF coil and coupled through the transmit/receive switch to a preamplifier. The amplified MR signals are demodulated, filtered, and digitized in the receiver section of a transceiver. The transmit/receive switch is controlled by a signal from the pulse generator module to electrically connect the RF amplifier to the coil during the transmit mode and to connect the preamplifier during the receive mode. The transmit/receive switch also enables a separate RF coil (for example, a surface coil) to be used in either transmit or receive mode. The MR signals picked up by the RF coil are digitized by the transceiver module and transferred to a memory module for image processing.

While MRI system 300 may include any suitable scanner or detector, in the illustrated embodiment, the system includes full body scanner 342 having housing 344 through which bore 346 is formed. Table 348 is moveable into the bore to permit patient 350 to be positioned therein for imaging selected anatomy within the patient.

MRI system 300 can include support circuits can include circuits such as cache, power supplies, clock circuits, and a communication bus (e.g., Internet or other network connectivity). Internal memory 337 can include random access memory (RAM), read only memory (ROM), disk drive, tape drive, etc., or combinations thereof.

Internal memory 337 can include executable computer instructions and/or code that when executed cause control processor unit to perform a method of self-calibrated, hybrid, non-linear phase-contrast correction in accordance with embodiments to process a signal received from scanner 342. As such, MRI system 300 can be implemented by a general purpose computer system that becomes a specific purpose computer system when executing the executable instructions.

Internal memory can also include an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

MRI system 300 can perform the acquisition techniques described herein, and, in some embodiments, the data processing techniques described herein. It should be noted that subsequent to the data acquisitions described herein, the system can simply store the acquired data for later access locally and/or remotely, for example in a memory circuit (e.g., memory 337). Thus, when accessed locally and/or remotely, the acquired data can be manipulated by one or more processors contained within an application-specific or general purpose computer. The one or more processors can access the acquired data and execute routines suitable for processing or analyzing the data, as described herein.

Figure 4:
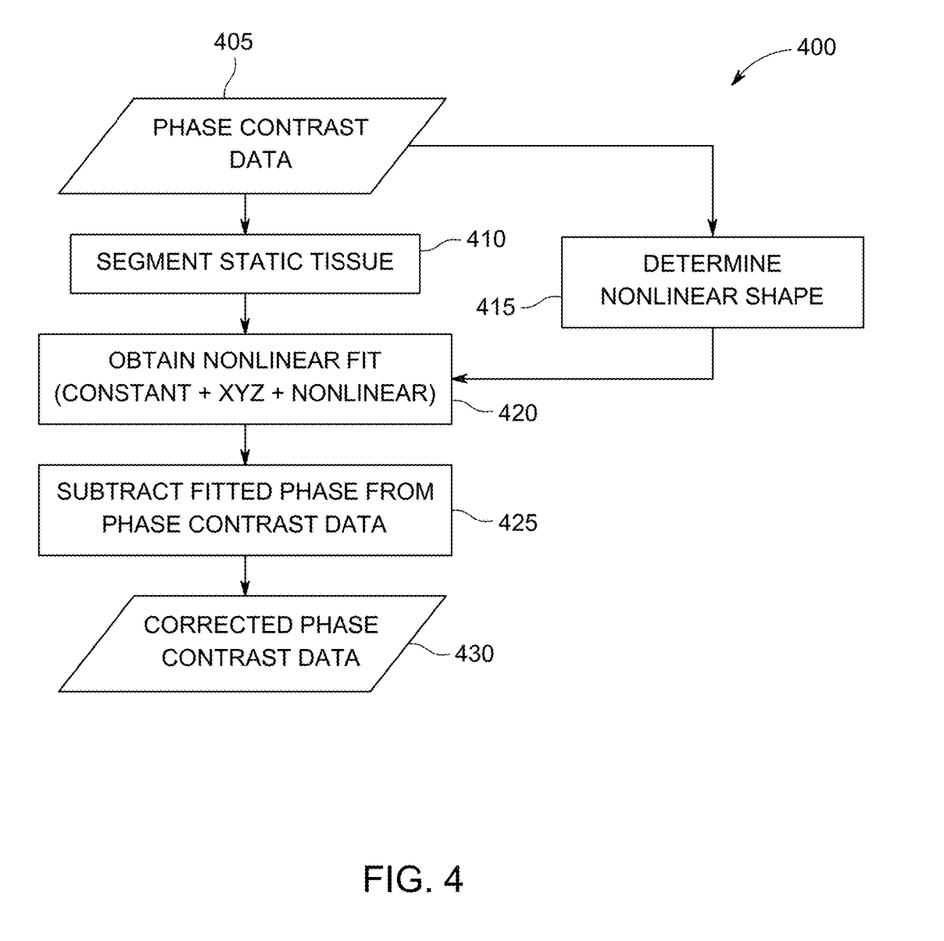
FIG. 4 depicts a non-linear correction process in accordance with some embodiments.

FIG. 4 depicts process 400 for performing a self-calibrated, hybrid, non-linear phase-contrast correction method in accordance with some embodiments. The system can receive, step 405, phase contrast signal data from an MRI scanner. At step 410, static tissue is segmented from non-static cardiovascular elements of the data. A non-linear fitted-phase basis function can be calculated, step 415, and used for self-calibration removal of system artifacts (e.g., eddy currents). These self-calibrated non-linear fitted phase terms can be calculated in advance and stored in internal or external memory.

The nonlinear phase can be determined as a function of the concomitant field map, an eddy-current field map, or a combination of both. The maps are derived as a function of the MRI gradient waveforms, and may be stored in the image header of the image signal data.

The calculated non-linear fitted-phase basis function is added, step 420, to the linear fit terms (constant and X, Y, Z pixel spatial coordinates) to obtain a non-linear fit. The non-linear fit is subtracted, step 425, from the phase contrast signal data to result in the corrected, step 430, phase contrast data.

Figure 5:
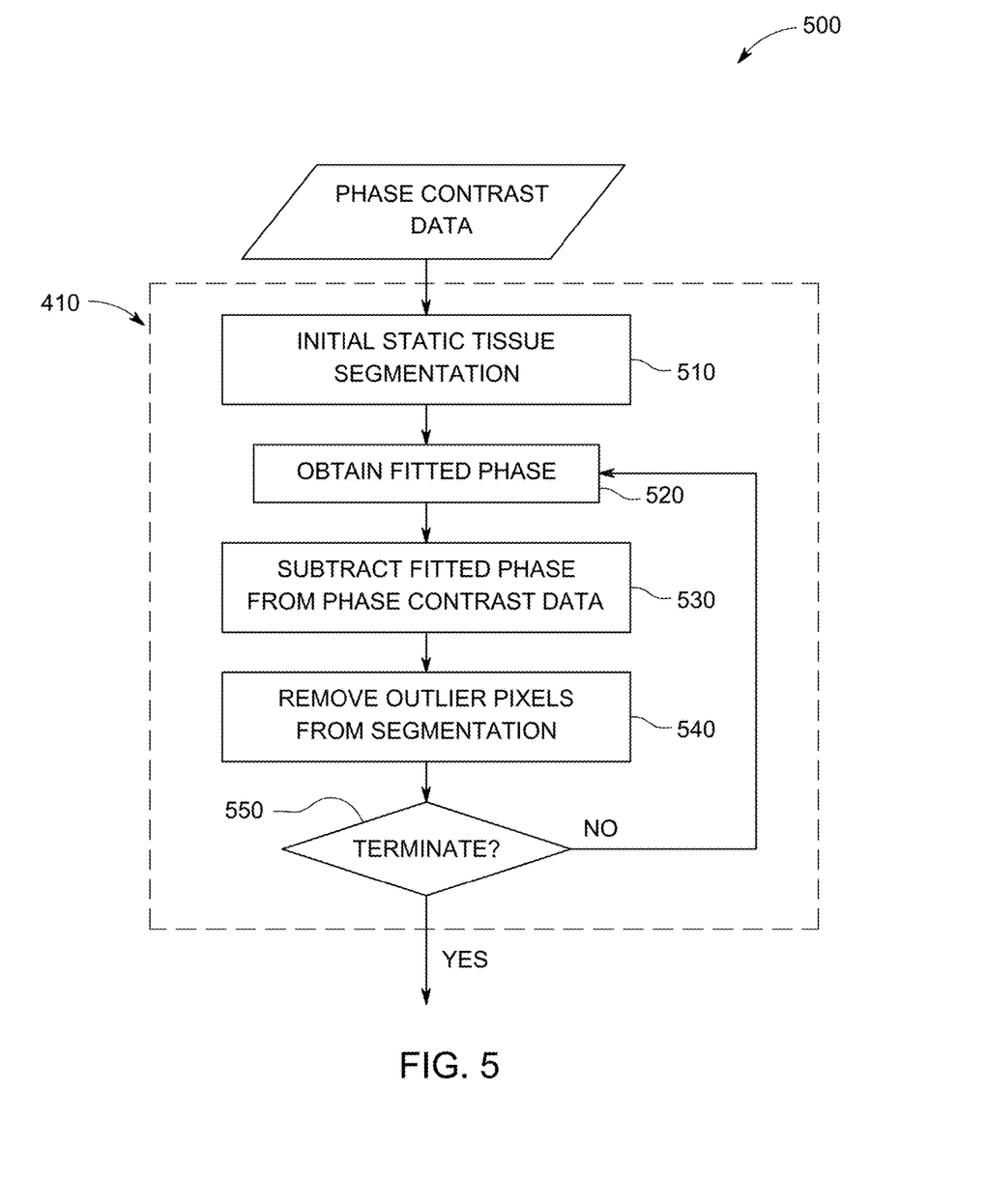
FIG. 5 depicts a static tissue segmentation process in accordance with some embodiments.

FIG. 5 depicts static tissue segmentation process 500 in accordance with some embodiments. In particular, process 500 expands the tissue segmentation of step 410 by using iterative removal of outliers. Initial static tissue segmentation is performed, step 510, on the phase contrast signal data. A fitted phase is obtained, step 520. The fitted phase is subtracted, step 530, from the phase contrast signal data. Outlier pixels are removed, step 540, from the results of the segmentation. At step 550, a decision is made regarding whether further iterations of removal are to be performed. If more iterations are to be performed, process 500 continues back to step 520. If there are no more iterations to be performed, process 500 terminates. The correction method continues as described above for process 400.

Figure 6:
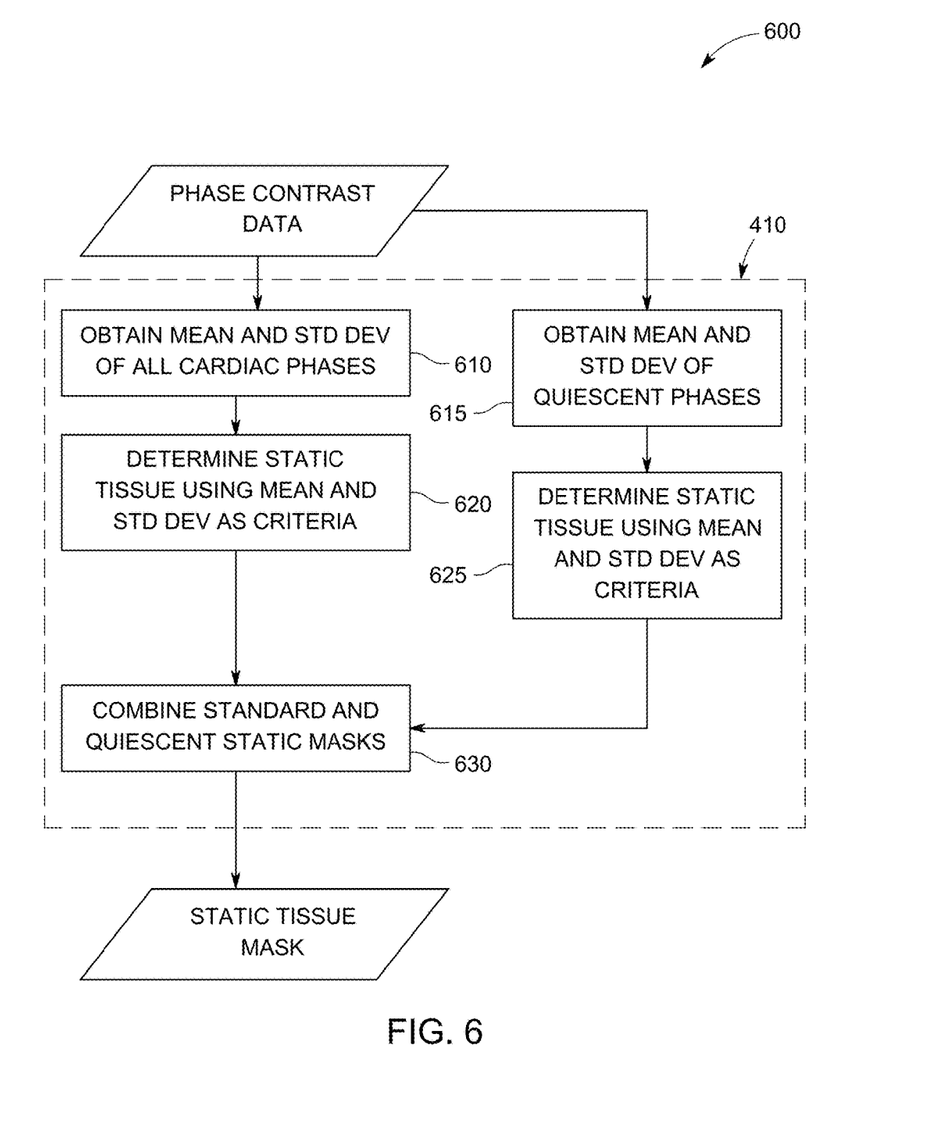
FIG. 6 depicts a static tissue segmentation process using quiescent cardiac phase in accordance with some embodiments.

FIG. 6 depicts static tissue segmentation process 600 using quiescent cardiac phase in accordance with some embodiments. In particular, process 600 expands the tissue segmentation of step 410 by using quiescent cardiac phase information to obtain the static tissue mask. The mean and standard deviation of all cardiac phases of the phase contrast signal data is obtained, step 610. Also, the mean and standard deviation of cardiac quiescent phases is obtained, step 615. Static tissue is determined, step 620, using both the mean and standard deviation of all cardiac phases from step 610. Also, static tissue is determined, step 625, using both the mean and standard deviation of the cardiac quiescent phases from step 615.

Both the static tissue determined from all cardiac phases (step 620) and the static tissue determined from the cardiac quiescent phases (step 625) are combined, step 630. Having now determined a static tissue mask, process 600 terminates and the correction method continues as described above for process 400.

Figure 7:
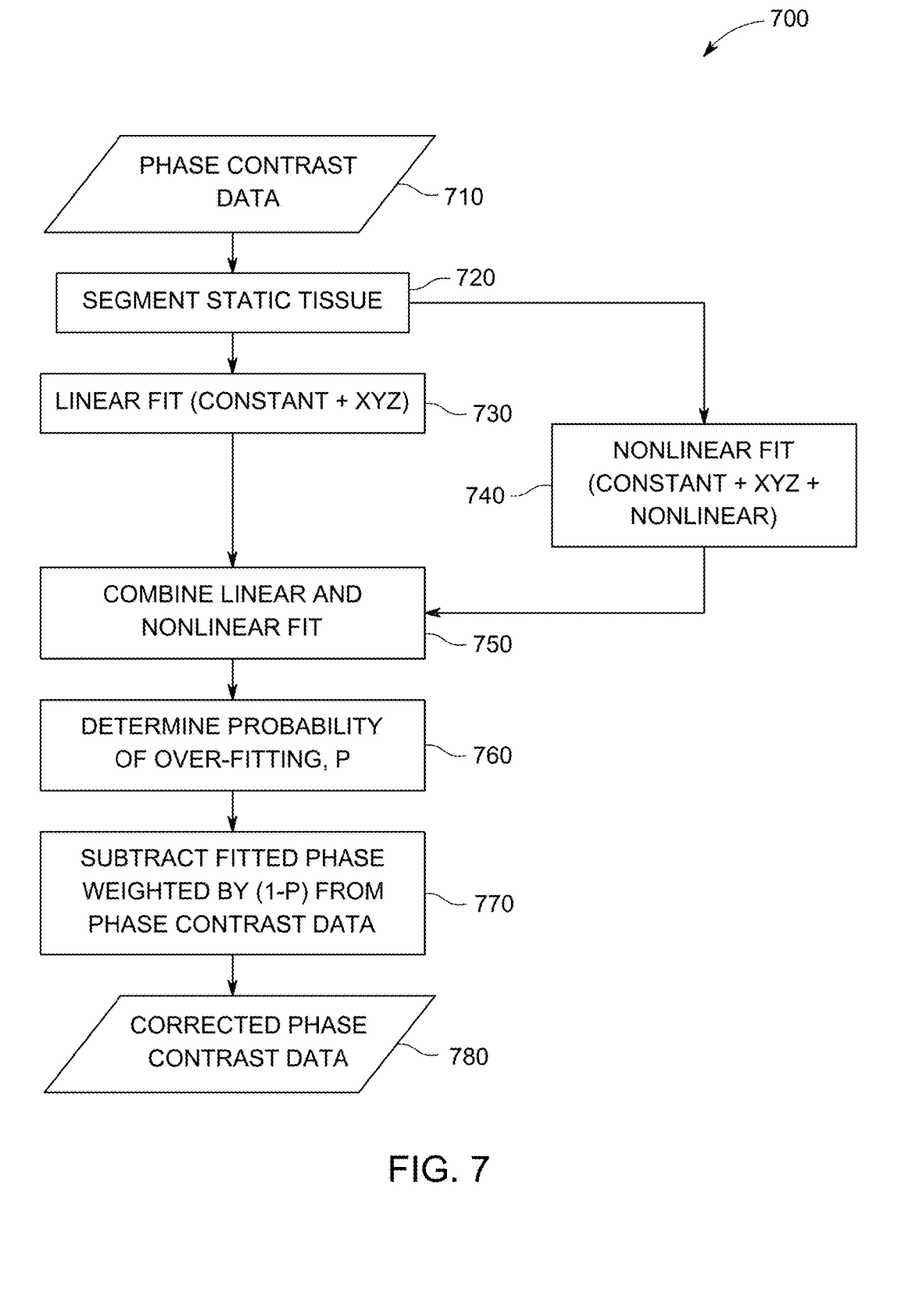
FIG. 7 depicts a correction process combining linear and non-linear phases in accordance with some embodiments.

FIG. 7 depicts correction process 700 that combines linear and non-linear phases in accordance with some embodiments. The system can receive, step 710, phase contrast signal data from an MRI scanner. At step 720, static tissue is segmented from non-static cardiovascular elements of the data. A four-term (constant, X, Y, and Z) linear fit is calculated, step 730. Also, a five-term (constant, X, Y, Z, and non-linear term) non-linear fit is calculated, step 740. The four-term linear and five-term non-linear fits are combined, step 750. A probability of over-fitting P is determined at step 760. The fitted phase weighted by (1−P) is subtracted, step 770, from the phase contrast signal data to result in the corrected, step 780, phase contrast data.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable instructions that when executed may instruct and/or cause a controller or processor to perform methods discussed herein such as a self-calibrated, hybrid, nonlinear phase-contrast correction method, as described above.

The computer-readable medium may be a non-transitory computer-readable media including all forms and types of memory and all computer-readable media except for a transitory, propagating signal. In one implementation, the non-volatile memory or computer-readable medium may be external memory (item 355; FIG. 3).

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A method of self-calibrated correction for residual phase in phase-contrast magnetic resonance (PCMR) imaging data, the method comprising:
   receiving PCMR image data from an MR scanner system;
   segmenting static tissue from non-static cardiovascular elements of the PCMR image data;
   calculating a non-linear fitted-phase basis function, the non-linear fitted-phase basis function based on physical properties of the MR scanner system;
   adding the non-linear fitted-phase basis function to linear-fit basis terms; and
   subtracting the result of the adding step from the PCMR imaging data.

2. The method of claim 1, removing system artifacts from the PCMR imaging data by applying the non-linear fitted-phase basis function as a self-calibration.

3. The method of claim 1, the linear fit terms including at least one of a constant term and spatial coordinates of relevant pixels of the PCMR imaging data.

4. The method of claim 1, wherein the segmenting step includes:
obtaining a fitted phase based on system artifacts of the MR scanner system;
subtracting the fitted phase from the PCMR imaging data;
removing outlier pixels from the segmentation result; and
repeating the obtaining, the subtracting, and the removing steps.

5. The method of claim 1, wherein the segmenting step includes:
obtaining a mean and a standard deviation of cardiac phases of the PCMR imaging data;
obtaining a mean and a standard deviation of quiescent phases of the PCMR imaging data;
determining a first set of static tissue using the cardiac phase mean and the cardiac phase standard deviation as criteria in identifying the first set of static tissue;
determining a second set of static tissue using the quiescent phase mean and the quiescent phase standard deviation as criteria in identifying the second set of static tissue; and
combining the first set of static tissue and the second set of static tissue to obtain a static tissue mask.

6. The method of claim 1, including:
calculating a linear fitted-phase basis function, the linear fitted-phase basis function based on system artifacts of the MR system;
combining the linear and the non-linear fitted-phase basis functions;
determining a probability of over-fitting; and
subtracting from the PCMR imaging data the fitted phase weighted by a factor of one minus the over-fitting probability.

7. The method of claim 1, wherein the predetermined non-linear term is one of a concomitant field and an eddy current map.

8. A non-transitory computer-readable medium having stored thereon instructions which when executed by a processor cause the processor to perform a method of residual phase in phase-contrast magnetic resonance (PCMR) imaging data, the method comprising:
receiving PCMR image data from an MR scanner system;
segmenting static tissue from non-static cardiovascular elements of the PCMR image data;
calculating a non-linear fitted-phase basis function, the non-linear fitted-phase basis function based on system artifacts of the MR scanner system;
adding the non-linear fitted-phase basis function to linear fit terms; and
subtracting the result of the adding step from the PCMR imaging data.

9. The medium of claim 8, including instructions to cause the processor to perform the step of removing system artifacts from the PCMR imaging data by applying the non-linear fitted-phase basis function as a self-calibration.

10. The medium of claim 8, wherein the linear fit terms include at least one of a constant term and spatial coordinates of relevant pixels of the PCMR imaging data.

11. The medium of claim 8, including instructions to cause the processor to perform the segmenting step by including:
obtaining a fitted phase based on system artifacts of the MR scanner system;
subtracting the fitted phase from the PCMR imaging data;
removing outlier pixels from the segmentation result; and
repeating the obtaining, the subtracting, and the removing steps.

12. The medium of claim 8, including instructions to cause the processor to perform the segmenting step by including:
obtaining a mean and a standard deviation of cardiac phases of the PCMR imaging data;
obtaining a mean and a standard deviation of quiescent phases of the PCMR imaging data;
determining a first set of static tissue using the cardiac phase mean and the cardiac phase standard deviation as criteria in identifying the first set of static tissue;
determining a second set of static tissue using the quiescent phase mean and the quiescent phase standard deviation as criteria in identifying the second set of static tissue; and
combining the first set of static tissue and the second set of static tissue to obtain a static tissue mask.

13. The medium of claim 8, including instructions to cause the processor to perform the steps of:
calculating a linear fitted-phase basis function, the linear fitted-phase basis function based on system artifacts of the MR scanner system;
combining the linear and the non-linear fitted-phase basis functions;
determining a probability of over-fitting; and
subtracting from the PCMR imaging data the fitted phase weighted by a factor of one minus the over-fitting probability.

14. A system for self-calibrated correction of residual phase in phase-contrast magnetic resonance (PCMR) imaging data, the system comprising:
an MR scanning apparatus configured to provide PCMR image data;
a scanner control circuit configured to control the scanning apparatus during image acquisition, the scanner control circuitry in communication with a control processor;
the control processor configured to execute computer-readable instructions that cause the control processor to:
receive PCMR image data from the MR scanner apparatus;
segment static tissue from non-static cardiovascular elements of the image data;
calculate a non-linear fitted-phase basis function, the non-linear fitted-phase basis function based on system artifacts of the MR scanning apparatus;
add the non-linear fitted-phase basis function to linear fit terms; and
subtract the result of the adding step from the PCMR imaging data.

15. The system of claim 14, including instructions to cause the processor to remove system artifacts from the PCMR imaging data by applying the non-linear fitted-phase basis function as a self-calibration.

16. The system of claim 14, wherein the linear fit terms include at least one of a constant term and spatial coordinates of relevant pixels of the PCMR imaging data.

17. The system of claim 14, including instructions to cause the processor to:
obtain a fitted phase based on system artifacts of the MR scanning apparatus;
subtract the fitted phase from the PCMR imaging data;
remove outlier pixels from the segmentation result; and repeat the obtaining, the subtracting, and the removing steps.

18. The system of claim 14, including instructions to cause the processor to:
- obtain a mean and a standard deviation of cardiac phases of the PCMR imaging data;
- obtain a mean and a standard deviation of quiescent phases of the PCMR imaging data;
- determine a first set of static tissue using the cardiac phase mean and the cardiac phase standard deviation as criteria in identifying the first set of static tissue;
- determine a second set of static tissue using the quiescent phase mean and the quiescent phase standard deviation as criteria in identifying the second set of static tissue; and
- combine the first set of static tissue and the second set of static tissue to obtain a static tissue mask.

19. The system of claim 14, including instructions to cause the processor to:
- calculate a linear fitted-phase basis function, the-linear fitted-phase basis function based on system artifacts of the MR scanning apparatus;
- combine the linear and the non-linear fitted-phase basis functions;
- determine a probability of over-fitting; and
- subtract from the PCMR imaging data the fitted phase weighted by a factor of one minus the over-fitting probability.

20. The system of claim 14, wherein the predetermined non-linear term is one of a concomitant field and an eddy current map.

* * * * *